United States Patent [19]

Enjo et al.

[11] Patent Number: 4,582,624
[45] Date of Patent: Apr. 15, 1986

[54] ETCHANT COMPOSITION

[75] Inventors: Naonori Enjo, Osaka; Koji Tamura, Kawanishi, both of Japan

[73] Assignee: Daikin Industris, Ltd., Osaka, Japan

[21] Appl. No.: 639,185

[22] Filed: Aug. 9, 1984

[30] Foreign Application Priority Data

Aug. 10, 1983 [JP] Japan ................................ 58-147213

[51] Int. Cl.$^4$ ........................ C09K 13/06; B44C 1/22; C03C 15/00
[52] U.S. Cl. .................................. 252/79.4; 156/653; 156/657; 156/662; 252/79.3
[58] Field of Search ..................... 252/79.3, 79.4, 142; 134/3; 156/653, 657, 662, 663

[56] References Cited

U.S. PATENT DOCUMENTS 4,055,458 10/1977 Niederprum et al. ......... 252/79.4 X

FOREIGN PATENT DOCUMENTS 84974 5/1983 Japan .

*Primary Examiner*—William A. Powell
*Attorney, Agent, or Firm*—Birch, Stewart, Kolasch & Birch

[57] ABSTRACT

An aqueous etchant composition comprising hydrogen fluoride, ammonium fluoride and a surfactant selected from a group consisting of fluorine-containing carboxylic acids and their salts, with which very minute and complicated pattern can be etched onto an oxidized silicon film on a semiconductor substrate.

24 Claims, No Drawings

ETCHANT COMPOSITION

FIELD OF THE INVENTION

The present invention relates to an etchant composition. More particularly, it relates to an etchant composition comprising a certain specific fluorine-containing surfactant.

BACKGROUND OF THE INVENTION

In wet etching of an oxidized silicon film on a semiconductor, hydrofluoric acid or its mixture with ammonium fluoride is used as an etchant. Ammonium fluoride is used for controlling an etching rate and for stabilizing the etching rate during the whole etching time. Usually, 5 parts by weight or more of a 40% aqueous solution of ammonium fluoride is used per part by weight of a 50% aqueous solution of hydrogen fluoride. Such a large amount of ammonium fluoride increases surface tension of the etchant comprising hydrofluoric acid so that its wettability to various films on the silicone substrate such as silicon dioxide and resist films is greatly deteriorated. Because of such the deteriorated wettability, the etchant does not penetrate into very thin gaps formed in very minute and complicated patterns of an integrated circuit, which causes various troubles such as incomplete etching. The wafer must be, therefore, pretreated with alcohol or a surfactant solution to improve its wettability with the etchant.

To eliminate the troublesome pretreatment of the wafer, it may be proposed to reduce the surface tension of the etchant by the addition of a surfactant to the etchant. Since ammonium fluoride, however, makes the solubility of the surfactant much worse, the kinds of the surfactants to be added to the etchant are very few.

In order to solve these problems, Japanese Patent Kokai Publication (unexamined) No. 53980/1983 describes an etchant composition comprising fluorine-containing diamine type surfactants. This composition, however, has several drawbacks. The composition has a low surface tension just after preparation, but after a long standing time, the composition separates into two phases. For instance, the surfactant concentrates into a surface layer of the composition and into an interface between the composition and a container so that the inner portion of the composition has an increased surface tension. When the composition is separated, the inherent effects of the addition of the surfactant disappear and some parts of the silicon dioxide film of the semiconductor are not completely etched. Even if the composition separates, the surfactant is redispersed by mixing and the surface tension of the etchant can be restored. However, the mixing is troublesome.

As a result of an extensive study, it has now been found that when certain specific fluorine-containing carboxylic acids or their salts are used as surfactants for an aqueous etchant composition comprising hydrogen fluoride and ammonium fluoride, they are transparently dissolved in the composition and do not cloud the composition. Further, they sufficiently lower the surface tension of the etchant composition and the obtained composition does not separate and has a constant surface tension throughout the composition after long standing.

SUMMARY OF THE INVENTION

According to the present invention, there is provided an aqueous etchant composition comprising hydrogen fluoride, ammonium fluoride and a surfactant selected from the group consisting of fluorine-containing carboxylic acids and their salts.

DETAILED DESCRIPTION OF THE INVENTION

Specific examples of the fluorine-containing carboxylic acid are those having the formula:

$$R_f COOH \qquad (I)$$

wherein Rf is a fluorine-containing hydrocarbon group having 3 to 20 carbon aoms.

The fluorine-containing hydrocarbon group used herein is intended to mean any saturated or unsaturated, straight or branched, substituted or unsubstituted hydrocarbon group containing at least one fluorine atom, in which at least one carbon-carbon bonding may be interrupted by an oxygen atom. Further, said group may contain at least one other halogen atom such as chlorine or bromine. Preferably, said group has 3 to 20, more preferably 5 to 9 carbon atoms and/or contained more fluorine atoms than the carbon atoms. Specific examples of the substituent are chlorine, bromine, iodine, ets.

Specific examples of a base which forms the salt with the fluorine-containing carboxylic acid (I) are ammonia and an aliphatic amine of the formula:

$$NR_1R_2R_3$$

wherein $R_1$, $R_2$ and $R_3$ are each hydrogen, $C_1$–$C_5$-alkyl or hydroxy-$C_1$–$C_5$-alkyl.

It is not preferred to use a base containing metal ion such as sodium hydroxide and potassium hydroxide, since it may deteriorate electric properties of the semiconductor which has been etched.

Among the bases to be preferably used, ammonia is most preferred since its salts have good solubility in the etchant composition and effectively lower the surface tension of the etchant and further do not deteriorate the material to be etched.

Preferred examples of the fluorine-containing carboxylic acid and its salt are $CF_3(CF_2)_nCOOH$, $(CF_3)_2CF-(CF_2)_nCOOH$, $HCF_2(CF_2)_nCOOH$, $CF_3(CF_2)_n(CH_2)_mCOOH$, $CF_3(CF_2)_n-CF=CH(CH_2)_mCOOH$ and $Cl(CF_2CFCl)_pCF_2COOH$ wherein n is an integer of 2 to 17, m is 1 or 2 and p is an integer of 1 to 9, and their salts with $NH_3$, $(CH_3)_3N$, $(C_2H_5)_2NH$, $C_3H_8NH_2$, $NH_2CH_2CH_2OH$, $NH(CH_2CH_2OH)_2$ and $N(CH_2CH_2OH)_3$.

Preferably, the surfactant to be used in the invention does not contain any metal ion such as potassium, sodium and calcium ions which deteriorate the electric properties of the semiconductor.

The etchant composition of the invention may be prepared by mixing all the components in water, and the order of addition of each component is not essential. For example, a necessary amount of the fluorine-containing carboxylic acid or its salt is added to either hydrofluoric acid or an aqueous solution of ammonium fluoride and then the other is added, or hydrofluoric acid and the solution of ammonium fluoride are mixed and then, to the mixture, the necessary amount of the fluorine-containing carboxylic acid or its salt is added. Further, necessary reactants may be added to a mixture of at least two of water, hydrofluoric acid and the aqueous solution of ammonium fluoride and reacted to form the fluorine-containing carboxylic acid or its salt. The last procedure includes steps for adding a fluorine-containing carboxylic fluoride to water, hydrogen fluoride and/or the aqueous solution of ammonium fluoride and for hydrolyzing the reaction product to form the fluorine-containing carboxylic acid and hydrofluoric acid.

The fluorine-containing carboxylic acid may be used alone or as a mixture of at least two of them.

The amount of the fluorine-containing surfactant is usually from 0.0001 to 1% by weight, preferably from 0.001 to 0.1% by weight based on the weight of the etchant composition. When the amount of the fluorine-containing surfactant is less than the above lower limit, the object of the invention is not achieved. When the amount is larger than the above upper limit, corresponding advantage is not found.

The ratio of hydrofluoric acid and ammonium fluoride may the same as the conventional one. Namely, 5 parts by weight or more of a 40% aqueous solution of ammonium fluoride is preferably added to 1 parts by weight for a 50% aqueous solution of hydrogen fluoride which results in a solution having at least 4 parts per weight of ammonium fluoride to 1 part by weight of hydrogen fluoride.

The etchant composition of the invention overcomes the above described drawbacks of the conventional etchant composition containing hydrofluoric acid and ammonium fluoride without deteriorating the good properties of said composition. Namely, the etchant composition of the invention does not separate after long standing and improves wettability to various films on the semiconductor substrate so that the composition easily penetrates between the gaps formed on the resist film. Thus, when etching a very minute pattern is to be etched, irregularities of etching are eliminated. Surprisingly, a material to be etched having thin gaps and wide gaps is etched at the same etching rate. The etchant composition of the invention does not foam, which is harmful to etching, and does not gather dust on the surface to be etched. Further, the addition of the fluorine-containing surfactant of the invention does not alter the etching rate of the silicon dioxide film. In addition, as the etchant composite of the invention has good wettability, it is possible to uniformly etch whole surface of patterned wafer.

The present invention will be explained further in detail by the following Examples, in which percentage and part are by weight.

EXAMPLES 1–4 AND COMPARATIVE EXAMPLES 1–6

Surface tension and Appearance of Etchant Composition

A surfactant was added to a mixture of predetermined amounts of 50% hydrofluoric acid, a 40% aqueous solution of ammonium fluoride and optionally pure water were mixed to prepare an etchant composition.

The prepared composition was kept standing at room temperature and test samples were periodically withdrawn to monitor the change of surface tension of the composition.

The sampling was carried out with a 20 ml plastic syringe with a plastic tube attached. The sampled liquid was charged in a 50 ml polytetrafluoroethylene flat dish, and surface tension was measured by means of a du Noüy type tensiometer.

The results are shown in Table 1 together with the appearance of the composition and the surface tension without the surfactant (blank).

TABLE 1

| | Surfactant (200 ppm) | Etchant (part) 50% hydrofluoric acid | Etchant (part) 40% solution of NH$_4$F | Etchant (part) Water | Surface Tension (dyn/cm) After preparation | Surface Tension (dyn/cm) 1 day later | Surface Tension (dyn/cm) 1 month later | Surface Tension (dyn/cm) 3 months later | Blank | Appearance[1] |
|---|---|---|---|---|---|---|---|---|---|---|
| Example 1 | H(CF$_2$)$_6$COOH | 1 | 1000 | — | 32 | 32 | 32 | 32 | 100 | Transparent |
| Example 2 | CF$_3$(CF$_2$)$_6$COONH$_4$ | 1 | 6 | — | 28 | 28 | 28 | 28 | 91 | Transparent |
| Example 3 | (CF$_3$)$_2$CF(CF$_2$)$_4$COONH$_4$ | 1 | 6 | 1 | 27 | 27 | 27 | 27 | 88 | Transparent |
| Example 4 | C$_4$F$_9$OCF(CF$_3$)COONH$_4$ | 1 | 30 | — | 30 | 30 | 30 | 30 | 96 | Transparent |
| Comparative Example 1 | C$_9$F$_{19}$—⟨phenyl⟩—O(CH$_2$CH$_2$O)$_{10}$H | 1 | 6 | — | — | — | — | — | 91 | Clouded |
| Comparative Example 2 | C$_{12}$H$_{15}$OSO$_3$NH$_4$ | 1 | 6 | — | — | — | — | — | 91 | Sediments |
| Comparative Example 3 | C$_{12}$H$_{25}$N(CH$_3$)$_3$Cl | 1 | 6 | — | — | — | — | — | 91 | Clouded |
| Comparative Example 4 | C$_9$F$_{19}$COO(CH$_2$CH$_2$O)$_{45}$CH$_3$ | 1 | 6 | — | 30 | 58 | 70 | 77 | 91 | — |
| Comparative Example 5 | C$_8$F$_{17}$SO$_3$N(C$_3$H$_7$)CH$_2$CH$_2$(CH$_2$CH$_2$)$_{20}$H | 1 | 6 | — | 31 | 61 | 74 | 79 | 91 | Clouded |
| Comparative Example 6 | C$_9$F$_{19}$CH$_2$CH(OH)CH$_2$NH(CH$_2$)$_3$N(CH$_3$)$_2$ | 1 | 6 | — | 27 | 63 | 81 | 86 | 91 | — |

Note:
[1]Appearance after one month from the addition of the surfactant.

With the surfactants used in Comparative Examples 1 to 3, the etchant compositions were clouded or sediments were found. Thus, they were unsatisfactory as an etchant composition for semiconductors in which very small amount of dust cause trouble. The compositions of Comparative Examples 4 to 6 showed sufficient low surface tension just after the preparation but separated after standing.

In contrast to the surfactants used in the Comparative Examples, the fluorine-containing carboxylic acids and their salts not only greatly decrease surface tension but also do not cause clouding or turbidity in the composition or form sediments. Surface tension is found to be constant throughout the composition and does not vary with the passage of time.

EXAMPLES 5–8 AND COMPARATIVE EXAMPLES 7 AND 8

Etching Test

On a silicon wafer of 50 mm in diameter on which a $SiO_2$ layer of 3,000 Å in thickness was formed by the thermal oxidation method, a positive type resist film of 8,000 Å in thickness was formed by a conventional method. On the resist film, 100 window patterns (each $1.5 \times 1.5$ micron square) were formed.

The water was immersed at 25° C. for 4 minutes in one liter of an etchant composition which had been prepared by adding 200 ppm of a surfactant to a mixture of 50% hydrofluoric acid and a 40% solution of ammonium fluoride in a weight ratio of 1:6 and kept standing for 1 month. Then, the water was washed with pure water.

After drying, the surface of the water was observed with a microscope, and the number of windows which were incompletely etched was counted. Thus, number is a criterion for wettability to the wafer and the penetrability of the etchant composition into the minute pattern.

The results are shown in Table 2.

TABLE 2

| | Surfactant | Percentage of incompletely etched window (%) |
|---|---|---|
| Example 5 | $H(CF_2)_6COONH_4$ | 0 |
| Example 6 | $CF_3(CF_2)_6COONH_4$ | 0 |
| Example 7 | $(CF_3)_2CF(CF_2)_4COONH_4$ | 0 |
| Example 8 | $C_4F_9OCFCOONH_4$ with $CF_3$ substituent | 0 |
| Comparative Example 7 | $C_9F_{19}COO(CH_2CH_2O)_{45}CH_3$ | 8 |
| Comparative Example 8 | Blank | 13 |

What is claimed is:

1. An aqueous etchant composition comprising:
   (a) hydrogen fluoride and ammonium fluoride wherein the ratio of hydrogen fluoride and ammonium fluoride is at least 5 parts by weight of a 40% aqueous solution of ammonium fluoride added to about 1 part by weight of a 50% aqueous solution of hydrogen fluoride; and
   (b) a surfactant selected from a group consisting of fluorine-containing carboxylic acids and their salts, and said salts having a base of the formula:

$NR_1R_2R_3$ wherein $R_1$, $R_2$ and $R_3$ are each hydrogen, $C_1$–$C_5$-alkyl or hydroxy —$C_1$–$C_5$-alkyl.

2. The aqueous etchant composition according to claim 1, wherein the fluorine-containing carboxylic acid is of the formula:

RfCOOH wherein Rf is a fluorine-containing hydrocarbon group having 3 to 20 carbon atoms.

3. The aqueous etchant composition according to claim 1, wherein the amount of the surfactant is from 0.0001 to 1% by weight based on the weight of the composition.

4. The aqueous etchant composition according to claim 1, wherein the surfactant is selected from the group consisting of $CF_3(CF_2)_nCOOH$, $(CF_3)_2CF(CF_2)_nCOOH$, $HCF_2(CF_2)_n$—COOH, $CF_3(CF_2)_n(CH_2)_mCOOH$, $CF_3(CF_2)_nCF=CH(CH_2)_mCOOH$ and $Cl(CF_2CFCl)_pCF_2COOH$ wherein n is an integer of 2 to 17, m is 1 or 2 and p is an integer of 1 to 9, and their salts are $NH_3$, $(CH_3)_3N$, $(C_2H_5)_2NH$, $C_3H_8NH_2$, $NH_2CH_2CH_2OH$, $NH(CH_2CH_2OH)_2$ and $N(CH_2CH_2OH)_3$.

5. The aqueous etchant composition according to claim 1, wherein the base is ammonia.

6. The aqueous etchant composition according to claim 1, wherein the amount of surfactant is from about 0.001–0.1% by weight based on the weight of the composition.

7. The aqueous etchant composition according to claim 1, wherein the hydrocarbon group has from 5 to 9 carbon atoms.

8. The aqueous etchant composition according to claim 1, wherein the fluorinated substituted carboxylic acid is further substituted with a substituent selected from the group consisting of chlorine, bromine, iodine and fluorine.

9. An aqueous etchant composition consisting essentially of:
   (a) hydrogen fluoride and ammonium fluoride, wherein the ratio of ammonium fluoride to hydrogen fluoride is at least 4 to 1 parts by weight; and
   (b) a surfactant selected from a group consisting of fluorine-containing carboxylic acids and their salts, said salts having a base of the formula:

$NR_1R_2R_3$ wherein $R_1$, $R_2$ and $R_3$ are each hydrogen, $C_1$–$C_5$-alkyl or hydroxyl-$C_1$–$C_5$-alkyl.

10. The aqueous etchant composition according to claim 9, wherein the fluorine-containing carboxylic acid is of the formula:

RfCOOH wherein Rf is a fluorine-containing hydrocarbon group having 3 to 20 carbon atoms.

11. The aqueous etchant composition according to claim 9, wherein the amount of the surfactant is from 0.0001 to 1% by weight based on the weight of the composition.

12. The aqueous etchant composition according to claim 9, wherein the base is ammonia.

13. The aqueous etchant composition according to claim 9, wherein the surfactant is selected from the group consisting of $CF_3(CF_2)_nCOOH$, $(CF_3)_2CF(CF_2)_nCOOH$, $HCF_2(CF_2)_n\text{—}COOH$, $CF_3(CF_2)_n(CH_2)_mCOOH$, $CF_3(CF_2)_nCF\text{=}CH(CH_2)_mCOOH$ and $Cl(CF_2CFCl)_pCF_2COOH$ wherein n is an integer of 2 to 17, m is 1 or 2 and p is an integer of 1 to 9, and their salts with $NH_3$, $(CH_3)_2N$, $(C_2H_5)_2NH$, $C_3H_8NH_2$, $NH_2CH_2CH_2OH$, $NH(CH_2CH_2OH)_2$ and $N(CH_2CH_2OH)_3$.

14. The aqueous etchant composition according to claim 1, wherein the amount of surfactant is from about 0.001–0.1% by weight based on the weight of the composition.

15. The aqueous etchant composition according to claim 1, wherein the hydrocarbon group has from 5 to 9 carbon atoms.

16. The aqueous etchant composition according to claim 1, wherein the fluorinated substituted carboxylic acid is further substituted with a substituent selected from the group consisting of chlorine, bromine, iodine and fluorine.

17. A process for wet etching an oxidized silicon film, comprising etching the oxidized silicon film with an aqueous etchant composition which comprises hydrogen fluoride, ammonium fluoride and a surfactant selected from the group consisting of fluorine-containing carboxylic acids and their salts, said salts having a base of the formula:

$NR_1R_2R_3$ wherein $R_1$, $R_2$ and $R_3$ are each hydrogen, $C_1$–$C_5$-alkyl or hydroxy $C_1$–$C_5$-alkyl.

18. The process according to claim 17, wherein the fluorine containing carboxylic acid is of the formula:

$R_fCOOH$ wherein Rf is a fluorine containing hydrocarbon group having 3 to 20 carbon atoms.

19. The process according to claim 17, wherein the amount of the surfactant is from about 0.0001 to 1% by weight based on the weight of the composition.

20. The process according to claim 17, wherein the base is ammonia.

21. The process according to claim 17, wherein the surfactant is selected from the group consisting of $CF_3(CH_2)_nCOOH$, $(CF_3)_2CF(CF_2)_nCOOH$, $HCF_2(CF_2)_n\text{—}COOH$, $CF_3(CF_2)_n(CH_2)_mCOOH$, $CF_3(CF_2)_nCF\text{=}CH(CH_2)_mCOOH$ and $Cl(CF_2CFCl)_pCF_2COOH$ wherein n is an integer of 2 to 17, m is 1 or 2 and p is an integer of 1 to 9, and their salts with $NH_3$, $(CH_3)_3N$, $(C_2H_5)_2NH$, $C_3H_8NH_2$, $NH_2CH_2CH_2OH$, $NH(CH_2CH_2OH)_2$ and $N(CH_2CH_2OH)_3$.

22. The process according to claim 17, wherein the amount of surfactant is from about 0.001–0.1% by weight based on the weight of the composition.

23. The process according to claim 17, wherein the hydrocarbon group has from 5 to 9 carbon atoms.

24. The process according to claim 17, wherein the fluorinated substituted carboxylic acid is further substituted with a substituent selected from the group consisting of chlorine, bromine, iodine and fluorine.

* * * * *